United States Patent
Avelar Araujo et al.

(10) Patent No.: US 10,246,767 B2
(45) Date of Patent: Apr. 2, 2019

(54) SLIDING ELEMENT, INTERNAL COMBUSTION ENGINE AND PROCESS FOR OBTAINING SLIDING ELEMENT

(71) Applicants: Mahle Metal Leve S/A, Jundiai (BR); Mahle International GmbH, Stuttgart (DE)

(72) Inventors: Juliano Avelar Araujo, Jundiai (BR); Robert R. Banfield, Sao Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 192 days.

(21) Appl. No.: 15/301,370

(22) PCT Filed: Apr. 1, 2015

(86) PCT No.: PCT/EP2015/057233
§ 371 (c)(1),
(2) Date: Sep. 30, 2016

(87) PCT Pub. No.: WO2015/150481
PCT Pub. Date: Oct. 8, 2015

(65) Prior Publication Data
US 2017/0121810 A1    May 4, 2017

(30) Foreign Application Priority Data
Apr. 2, 2014    (BR) .............. 102014007893

(51) Int. Cl.
*C23C 14/06* (2006.01)
*C23C 14/02* (2006.01)
(Continued)

(52) U.S. Cl.
CPC ............ *C23C 14/0605* (2013.01); *C23C 8/24* (2013.01); *C23C 14/022* (2013.01); (Continued)

(58) Field of Classification Search
USPC .............. 428/216, 217, 336, 408, 457, 698; 277/442; 427/249.1, 577; 123/41.71,
(Continued)

(56) References Cited

U.S. PATENT DOCUMENTS 6,325,385 B1 * 12/2001 Iwashita ................... F16J 9/26
                                                                     277/442
6,716,540 B2 * 4/2004 Kohara ................ C23C 14/025
                                                                     428/332
(Continued)

FOREIGN PATENT DOCUMENTS

EP    2432913 A1    3/2012
EP    2574685 A1    4/2013
(Continued)

OTHER PUBLICATIONS

English abstract for JP-2010-100878.
English abstract for JP-4331292.

*Primary Examiner* — Archene A Turner
(74) *Attorney, Agent, or Firm* — Fishman Stewart PLLC

(57) ABSTRACT

A sliding element for internal combustion engines may include a ferrous base provided with a film applied upon a sliding surface. The film may have, sequentially, a metal connecting layer, a transitional layer, and a contact layer. The transitional layer may include a carbide containing a metal element. The contact layer may contain DLC (diamond-like carbon) doped with the metal element of the transitional layer, the DLC containing a maximum of 2% hydrogen by weight. An atomic ratio between metal and carbon in the contact layer in terms of a ratio Me/C is equal to or less than 0.1.

20 Claims, 1 Drawing Sheet

(51) Int. Cl.
  *C23C 8/24* (2006.01)
  *C23C 14/16* (2006.01)
  *C23C 14/32* (2006.01)
  *C23C 16/50* (2006.01)

(52) U.S. Cl.
  CPC .......... *C23C 14/024* (2013.01); *C23C 14/025* (2013.01); *C23C 14/16* (2013.01); *C23C 14/325* (2013.01); *C23C 16/50* (2013.01)

(58) Field of Classification Search
  USPC .................. 123/90.48, 90.51, 188.11, 193.6; 384/445, 492; 204/192.15, 192.16
  See application file for complete search history.

(56) References Cited

U.S. PATENT DOCUMENTS

| | | |
|---|---|---|
| 8,123,227 B2 | 2/2012 | Kawanishi et al. |
| 8,746,976 B2 | 6/2014 | Kennedy et al. |
| 8,986,821 B2 | 3/2015 | Hoppe et al. |
| 9,086,148 B2 | 7/2015 | Kennedy |
| 2011/0195265 A1* | 8/2011 | Oohira .................. C23C 14/025 204/192.16 |
| 2012/0270064 A1* | 10/2012 | Okamoto .............. C23C 14/024 204/192.15 |
| 2013/0146443 A1 | 6/2013 | Papa et al. |

FOREIGN PATENT DOCUMENTS

| | | | |
|---|---|---|---|
| JP | 2006-057674 | * | 3/2006 |
| JP | 4331292 B2 | | 9/2009 |
| JP | 2010-100878 A | | 5/2010 |
| JP | 2013-528697 A | | 7/2013 |

* cited by examiner

SLIDING ELEMENT, INTERNAL COMBUSTION ENGINE AND PROCESS FOR OBTAINING SLIDING ELEMENT

CROSS-REFERENCE TO RELATED APPLICATIONS

This application claims priority to Brazilian Patent Application No. 10 2014 007893 2, filed on Apr. 2, 2014, and International Patent Application No. PCT/EP2015/057233, filed Apr. 1, 2015, both of which are hereby incorporated by reference in their entirety.

TECHNICAL FIELD

The present invention relates to a sliding element for use in internal combustion engines, which sliding element is provided with a ferrous base whereupon there is applied a film comprising, sequentially, a transitional layer, a connecting layer, and a contact layer comprising DLC (diamond-like carbon) doped with a metal element, with a view to increasing the longevity of the sliding element through the improvement of the fatigue strength and wear resistance thereof and, concomitantly, to preventing the wear of the components of the engine interacting with said sliding element.

BACKGROUND

In view of the growing demands of the automotive industry, new requirements have emerged directly reflected in a greater stress on the components of internal combustion engines. In this manner, the current engine components, not being designed for such demand, experience premature wear. Some of the parts which naturally experience this effect are the sliding elements, particularly piston rings and bearings.

Innumerable developments have emerged with the objective of improving the fatigue strength and the wear resistance of the components of an internal combustion engine, nevertheless the increase in the working pressures of the internal combustion engines and the growing demand for reduction in friction and increase in the durability of the components of an engine render the success of such attempts difficult by virtue of their leading on one of the sliding elements, or on the other components of the engine, to premature wear and failure, in addition to not satisfying the new demands such as the reduction in friction having direct impact on the reduction of emissions.

It is also noted that the future will not be straightforward for this field of activity, it being sufficient to observe that more potent engines are required attaining higher rotational speeds, efficiently, with lower consumption and with high load capacity. All these factors threaten the development of the engine in the long term, prejudicing the functioning of the engine, or moreover the failure thereof.

Naturally, in view of the new requirements, the emergence of new materials is required given that those already known are the same ones restricting the development of internal combustion engines today. Some of the most important components in order to achieve a better engine performance are the sliding elements, such as piston rings, bearings, pins, etc. Due to the innovations in sliding elements, having greater hardness, greater fatigue strength and wear resistance, low coefficient of friction, and consequently longer working life, the automotive industry has modernised in tandem with the development of increasingly efficient, powerful and durable engines, confronting the high load to which they are subjected.

It is understood that the greater the hardness of the coating applied to the sliding element the lower the rate of wear, however the greater the hardness of the sliding element the more fragile it becomes and more internal stresses are generated during the manufacture thereof, resulting particularly in an increase in the probability of delamination of the coating on the sliding element, detachment of the hardest layer coating the component, or even the breakage or rupture of the component.

In this sense, sliding elements of the state of the art have attempted to reach an equilibrium through having a coating of sufficiently high hardness such that it does not wear easily in contact with other components of the engine. Such an effect has been achieved through deposition of films of DLC (diamond-like carbon), the electronic structure of the carbon whereof is principally sp3. More particularly, this type of deposition makes use of tetragonal amorphous carbon (ta-C), that is to say carbon free of or having low hydrogen content.

As a rule, upon the metal base of a sliding element there is applied a connecting layer which subsequently receives the layer of DLC, it being possible that the metal base receives a nitriding treatment or a PVD coating prior to receiving the connecting layer.

In fact, films deposited with DLC tend to have a very great wear resistance by virtue of the high hardness thereof, however they also present disadvantages. It is not solely the hardness which ensures the longevity of a component coated with DLC, but also the thickness of the film. In this sense, at least in theory, thicker films offer greater durability for the same rate of wear. Nevertheless, as is known, the deposition of a film of DLC generates very high internal stresses, creating limitations in the process of deposition and growth of thicker layers.

One of the documents of the state of the art relevant to the present invention is the U.S. Pat. No. 8,123,227 describing a sliding element wherein the sliding surface is coated with a hard film of amorphous carbon having a roughness equal to or less than 0.7 micrometers and an initial wear height lying between 0.07 and 0.14 micrometers.

For a film or a coating of pure carbon the high hardness is a critical factor for the obtainment of a suitable surface finish, fundamental for the low wear on the mating body, an engine liner. For this reason, in this coating, the roughness needs to be controlled with the objective of minimising the initial wear, generating additional costs in the process and rendering the coating unviable for some automotive applications. The layers described in this coating are capable of being finished, however due to the high internal stress the thickness is limited to between 2 and 4 microns. In the proposed coating, the tungsten functions as an internal stress reducer, rendering possible the construction of layers having a thickness exceeding 10 microns, without prejudicing the wear resistance thereof.

The document EP 2432913 discloses a sliding element for internal combustion engines, especially piston rings, provided with a coating of DLC of the ta-C type having at least one residual stress gradient. In this case, to obtain thick coatings manipulation of the internal stresses is utilised by means of the manipulation of the sp2 and sp3 structures. Furthermore, it is known that coatings having sp2 structures have less wear resistance.

The document JP 2013528697 also describes a sliding element and a process for obtaining a sliding element for internal combustion engines, especially piston rings, being provided with at least one sliding surface having a coating comprising, from inside to outside, metal provided with an adhesive layer and a layer of DLC of the ta-C type having a thickness of a minimum of 10 microns. To obtain thick coatings the manipulation of the internal stresses is utilised, permitting up to 60% of the sp2 structure, and there is also contemplated the addition of hydrogen; both cases led to a reduction in the wear resistance, by virtue of the coating being distant from the pure columnar structure of diamond (100% sp3).

The document EP 2574685 describes a sliding element and method of obtainment of the sliding element comprising a coating of the diamond-like carbon (DLC) type upon a substrate of the sliding element, and a material 20% to 40% softer than the DLC deposited on the surface of the coating of DLC, wherein the aforementioned softer material comprises a metal or metal oxide softer than the coating of DLC. The solution favours the matter of conditioning/running in of the surface at the commencement of operation, adding a soft material however having a higher coefficient of friction, leading to the loss of performance of the engine at the commencement of operation thereof.

The Japanese document JP 4331292 discloses a composite film provided with good adhesion to the base material, together with a low coefficient of friction due to the formation of a first hydrogen-free layer which is deposited upon the base, and the formation of a second layer including hydrogen which acts as the sliding layer.

This coating is a matter of a system having at least two layers, wherein one of the layers is hydrogenated, it being known that hydrogenated layers have a higher coefficient of friction and lower wear resistance when compared with hydrogen-free layers of DLC. The present invention is hydrogen-free.

Consequently, in addition to the limitation on the increase of the thickness of the layers, there is a limitation in respect of the homogeneity of the hardness in the coated layer. This lack of uniformity flows from the variation of the residual stresses which, during the deposition of the DLC, need to be monitored, reducing the intensity of the deposition to maximise the prevention of the accumulation of internal stresses in the most susceptible regions. The result is a film having a variation in hardness, leading to prejudicing the wear resistance and reducing the working life of the component.

In this manner, one of the great problems existing today in the deposition of ta-C films arises from the lack of uniformity of the hardness and of the inability to reduce the internal stresses, preventing the growth of layers of DLC having greater thickness.

It is consequently necessary to achieve a solution ensuring the matter of durability, heeding the necessity of wear not occurring on the components with which the sliding element interacts and, moreover, of maintaining a homogenous hardness throughout the surface of the film, concomitantly rendering it possible to deposit the film of DLC with less internal stress.

SUMMARY

And, consequently, one object of the present invention is to provide a sliding element for use in internal combustion engines capable of reconciling different characteristics responsible for better wear resistance both for the sliding element and for the surfaces of the components of the engine with which such sliding element interacts.

And, additionally, an object of the invention is to provide a sliding element having low friction for use in internal combustion engines comprising a ferrous base whereupon is applied a film comprising a connecting layer, a transitional layer, and a contact layer comprising DLC (diamond-like carbon) doped with a metal element, with a view to increasing the longevity of the sliding element through the improvement in the fatigue strength and the wear resistance and, concomitantly, to prevent the wear of the components of the engine which interact with the said sliding element.

And, furthermore, an object of the present invention is to provide a film having a homogenous hardness throughout the surface thereof and which, concomitantly, achieves obtaining a layer of DLC having lower internal stress.

The objects of the present invention are achieved by a sliding element for internal combustion engines provided with a film applied upon the sliding surface, the sliding element comprising a ferrous base whereupon is applied the film comprising, sequentially, a connecting layer, a transitional layer, and a contact layer, wherein the transitional layer comprises a carbide containing a metal element and the contact layer contains DLC (diamond-like carbon) doped with the metal element of the transitional layer, wherein the metal element is equal to or less than 5% atomically, wherein the DLC contains as a maximum 2% hydrogen by weight.

The sliding element, object of this application, for internal combustion engines may include, however is not limited to, a bearing, a piston ring, an engine cylinder, and other components of internal combustion engines having sliding properties.

The objects of the present invention are furthermore achieved by a process for obtaining a sliding element for internal combustion engines comprising the following stages of deposition:

stage (i): ion bombardment of a ferrous base (2) to clean the surface of the sliding element (1) which will receive the film (6);

stage (ii): deposition of a metal connecting layer (3);

stage (iii): increase in the flow of reactive gas to the maximum value such as to form a transitional layer (4); and stage (iv): deposition of a contact layer (5) under constant process conditions

BRIEF DESCRIPTION OF THE DRAWINGS

The present invention shall be described below in greater detail based on an example of embodiment represented in the drawings. The figures show.

DETAILED DESCRIPTION

Figure 1:
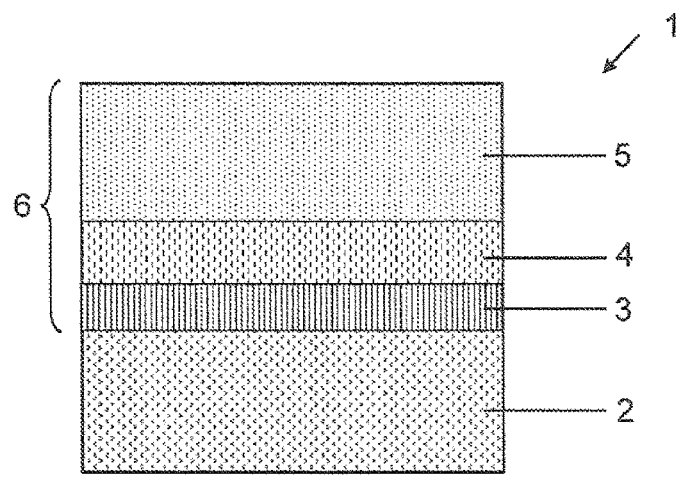
FIG. 1 is a representation of the layers of the sliding element of the present invention.

FIG. 1 shows a cross-section view of the sliding element 1 of the present invention. In a preferential, however not obligatory, manner the sliding element 1 of the present invention comprises a ferrous base material 2 such as, for example, stainless steel containing 10% to 17% chromium, carbon steel or cast iron. Upon this base material there may be applied a nitrided layer and/or it may even have a nitrided layer applied by PVD. Over the base material 2 there is directly applied a metal connecting layer 3 or, optionally, as occurs in solutions of the state of the art, the material base 2 receives a nitriding treatment or a PVD coating prior to receiving the connecting layer 3.

As principal characteristic, the metal connecting layer 3 comprises chromium, nickel or cobalt having a face centred cubic (fcc) structure wherein, in a preferential but not obligatory manner, there is applied a polycrystalline columnar layer of chromium having an fcc structure. In particular, the connecting layer has a thickness varying between 500 nm and 1000 nm.

Additionally, the present invention has as innovative characteristic the fact of applying upon the connecting layer 3 a transitional layer 4 composed, for example, of tungsten carbide ($WC_{1-x}$), chromium carbide ($CrC_{1-x}$) or niobium carbide ($NbC_{1-x}$). This transitional layer 4 has as objective thereof to act as a cushion between the two adjacent layers. In other words, the transitional layer 4 acts in the sense of relieving the stresses between the metal structure of the connecting layer 3 and the contact layer 5, which has high internal stress.

The transitional layer 4 comprises a thickness varying between 0.05 and 0.50 microns and the structure thereof is hexagonal and comprises a nanocrystalline or even amorphous phase. In the case of a nanocrystalline phase, this may be indexed in the case of utilisation of the metal tungsten as $WC_{1-x}$, (JCPDS card number 20-1316). This transitional layer 4 furthermore has as characteristic the strengthening of the adhesion to the connecting layer 3 and the contact layer 5.

In a manner differing from the solutions of the state of the art, which make use of variation of the internal stress (patents EP 2432913B1 and EP 2432915B1) during the deposition of the film of hydrogen-free carbon in order to achieve greater thicknesses of the film deposited, the present invention has a different concept as basis therefor. In this manner, the contact layer 5 comprises a film of hydrogen-free DLC (having as a maximum 2% hydrogen) in order to configure a structure having predominantly carbon bonds in the sp2 and sp3 form, wherein the deposition of the film of hydrogen-free DLC is doped with a metal of the transitional layer 4, wherein the quantity of the metal element is equal to or less than 5% atomically, to form a layer of DLC having low internal stresses. The thickness of the contact layer 5 varies between 3000 nm and 30 000 nm.

In spite of being unexpected, the effect may be theoretically explained by the fact that the metal in the interior of the carbon structure acts as an abatement element, providing greater strength and maintaining at an excellent level the coefficient of friction and the wear resistance of the film of hydrogen-free carbon.

Moreover, in addition to a lower value of internal stress, there has also been observed a difference in the Young's modulus between the metal structure (approximately 180 GPa) and the connecting layer 3 (between 180 and 300 GPa) and the contact layer 5 (approximately 300 GPa) comprising DLC doped with metal. With the objective of preventing complications during mechanical loading, it is absolutely necessary for the transitional layer 4 to possess a Young's modulus intermediate between that of the connecting layer 3 and the contact layer 5.

As a result, the film 6 of the present invention, the dimension whereof varies between 4 and 25 microns, achieves reduction of the internal stresses and limits the propagation of fissures, resulting in an increase in the wear resistance and low friction of the film 6. With the objective of obtaining different structures within the film of tetragonal amorphous carbon (ta-C) doped with metal (a-C:Me), the contact layer 5 grows through the application of high deposition energy wherein the sp3 hybridisations of the tetrahedral configuration and the sp2 hybridisation are the predominant formations, explaining the high hardness of the coating. More particularly, the structure of the carbon of the contact layer 5 is predominantly composed of the sp2 structure, such that the ratio between the integrated intense D and G bands in the Raman spectrum lies between 0.2 and 1.0.

The control of the internal stresses occurs in an appropriate manner by virtue of the fact that it derives from the interfaces between the film 6 and the base material 2, and the doping of the contact layer 5 with the WC of the transitional layer 4 through a spraying process at low power.

The doped metal together with the contact layer 5 must be the same as utilised in the formation of the transitional layer 4. Consequently, for example, if a transitional layer 4 of tungsten nitride is utilised, the doped metal in the DLC shall also be tungsten.

In a possible preferential configuration, the quantity of metal utilised in the doping is a maximum of 5% by atomic weight. For such reason, the contact layer or DLC may be both nanostructured and amorphous, this being because the metal may be in solid solution in the structure of the DLC, resulting in the amorphous configuration, or it may be in small islands of the metal element, resulting in the nano-structure configuration.

For such reason and through it still not being possible to definitely determine the manner of association of the metal with the structure of the carbon in respect of the aforestated quantities, the contact layer 5 is referred to as a doped DLC layer. Additionally, the nanocrystalline or amorphous formation of the layer of a-C:W is attributed to the fact that the deposition of the WC is a combination of cathodic arc PVD and PVD spraying processes. Furthermore, the layers containing metal are deposited by the PACVD (Plasma Assisted Chemical Vapour Deposition) or PVD (Plasma Vapour Deposition) process.

The process for obtaining a sliding element for internal combustion engines comprises the following stages of deposition:

stage (i): ion bombardment of a ferrous base (2) to clean the surface of the sliding element (1) which will receive the film (6);

stage (ii): deposition of a metal connecting layer (3), preferably, however not obligatorily, of tungsten;

stage (iii): increase in the flow of reactive gas to the maximum value such as to form a transitional layer (4); and stage (iv): deposition of a contact layer (5) under constant process conditions.

It must be noted that during the depositions of stages (iii) and (iv) there are also used at least two diametrically opposed targets (metal or graphite).

The present invention is based on the recent discoveries regarding the morphology of the microstructure of the present film 6, together with the new processes of deposition which achieve a better adhesion through the addition of two combined layers of crystalline metal material (W) combined with an amorphous structure, such properties resulting in the diminishment of the rates of wear and in the increase in the toughness of the material.

With the objective of maintaining the DLC structure with the recognised tribological performance thereof, and improving the durability of the film 6 through the increase in the thickness, the addition (doping) of the metal element is necessary. As a great advantage, the metal element (for example, tungsten) has no impact on the hardness of the layer of DLC, by virtue of not interfering in the formation of the sp2 carbon bonds, but does in relieving the internal stresses. Here, the metal is inserted into the layer deposited in the form of carbides, compounds with carbon. The tungsten is added at an appropriate alloying level, but below the levels exhibited by the ceramics, whilst maintaining the elastic properties of the metal constituents not based on the formation of carbides, which tend to be more tolerant to damage, but preventing typical defects found in the DLC coatings, such as low adherence to the substrate and limitations on building thick layers.

The diverse experiments with automotive components carried out prior to the present invention reveal that, in many tribological contact situations of sliding and abrasion, the coatings having higher hardness present better performance. The present invention has an alternative approach of an amorphous/nanocrystalline film 6 sufficiently hard to obtain superior results having as a basis two basically different approaches.

In the first place, due principally to a combination of strength and toughness more suited to the properties of the base material and the requirements thereof, in essence these coatings tend to be inherently more tolerant to damage, preventing the typical defects found in coatings based on carbon, such as detachment.

In the second place, the nanocrystalline or amorphous metal phase acts as a point of relief of stress and provides additional protection against the wear of the mating body (such as, for example, an internal cylinder wall in the piston ring/cylinder pair) with the objective of ensuring the good performance thereof as a function of all the operational states of the engine and of ensuring a long working life of the engines by means of an approach of high durability with low values of friction.

Figure 2:
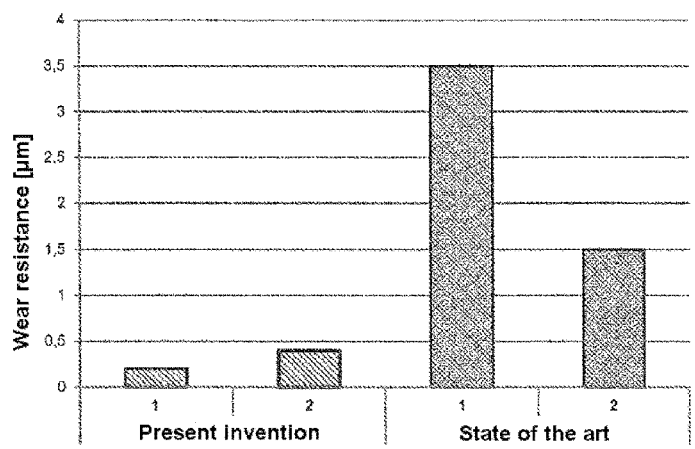
FIGS. 2 and 3 show a comparison of wear resistance and of delamination between samples of the present invention and of the state of the art.
Figure 3:
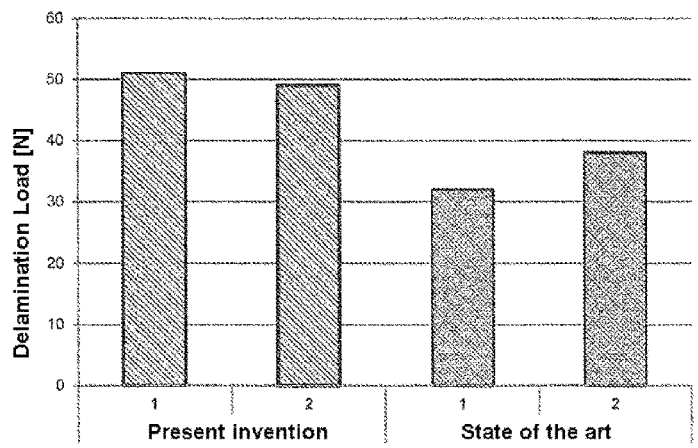

FIGS. 2 and 3 show a comparison of the wear resistance and of the delamination between the samples of the present invention and of the state of the art. Two trials were carried out for the samples of the present invention and two trials for the samples of the state of the art, the following results being obtained:

|  | Present invention | | State of the art | |
| --- | --- | --- | --- | --- |
| Sample | 1 | 2 | 1 | 2 |
| Wear resistance | 0.2 | 0.4 | 3.5 | 1.5 |
| Delamination load | 51 | 49 | 32 | 38 |

According to that found, the samples of the present invention have greatly superior wear resistance to that of the samples of the state of the art. In the same manner, the samples of the present invention reveal supporting a much greater load prior to the occurrence of delamination, when compared with the samples of the state of the art.

In this manner, the constructive configuration of the present invention exceeds the initial expectation, fully justifying the new sliding element 1. Consequently, the excellent results achieved ensure that a sliding element 1 having a high hardness may exist and increase the longevity of the components of an internal combustion engine. The increase in longevity of these components also results in a much greater increase over the normal longevity of the working life of the engine itself, including in those more modern engines the stresses whereof are considerably greater. In this manner, the result achieved by the sliding element 1 of the present invention is so superior to that of the state of the art that it is anticipated as being a commercial success through achieving preventing not solely the own wear thereof, but also the wear on the other components of the engine wherewith it interacts. Consequently, the present invention comprises not solely the sliding element 1 but also an engine containing the sliding element 1 of the present invention.

In this manner, the clear advantage of the sliding element 1 of the present invention will be evident, wherein the combination of the chemical elements deposited in a specific manner is the source of excellent results not previously achieved.

An example of preferred embodiment having been described, it shall be understood that the scope of the present invention encompasses other possible variations being limited solely by the content of the attached claims, the possible equivalents being included therein.

The invention claimed is:

1. A sliding element for internal combustion engines, comprising a ferrous base provided with a film applied upon a sliding surface, the film having, sequentially, a metal connecting layer, a transitional layer, and a contact layer, wherein:
   the transitional layer includes a carbide containing a metal element;
   the contact layer contains DLC (diamond-like carbon) doped with the metal element of the transitional layer, the DLC containing a maximum of 2% hydrogen by weight;
   an atomic ratio between metal and carbon in the contact layer in terms of a ratio Me/C is equal to or less than 0.1; and
   the connecting layer includes one of chromium, nickel or cobalt having a face centred cubic (fcc) structure.

2. A sliding element according to claim 1, wherein the contact layer includes amorphous carbon (ta-C or a-C) doped with the metal element, the metal element being a maximum of 5% atomically.

3. A sliding element according to claim 1, wherein the metal element utilised in the transitional and contact layers is one of tungsten, chromium or niobium.

4. A sliding element according to claim 1, wherein the contact layer includes a layer of hydrogen-free DLC doped with the metal element, wherein the layer of DLC is nanostructured or amorphous.

5. A sliding element according to claim 1, wherein the carbon of the contact layer has structures of sp3 and sp2, in such manner that a ratio between integrated intense D and G bands in a Raman spectrum lies between 0.2 and 1.0.

6. A sliding element according to claim 1, wherein the transitional layer includes tungsten carbide, chromium carbide, or niobium carbide.

7. A sliding element according to claim 1, wherein the transitional layer has a thickness which varies between 0.05 and 0.50 microns.

8. A sliding element according to claim 1, wherein a thickness of the film varies from 5 to 25 microns.

9. A sliding element according to claim 1, wherein a hardness of the film varies between 2500 HV and 5000 HV.

10. A sliding element according to claim 1, the base material consists of stainless steel containing 10% to 17% of one of chromium, carbon steel or cast iron.

11. A sliding element according to claim 1, further comprising a polycrystalline columnar layer of chromium having an fcc structure.

12. A sliding element according to claim 1, wherein the connecting layer is obtained through vapour deposition by means of any metal source.

13. A sliding element according to claim 1, wherein the layers containing metal are deposited by one of a PACVD (plasma assisted chemical vapour deposition) process or a PVD (plasma vapour deposition) process.

14. A sliding element according to claim 1, wherein the connecting layer is obtained by a cathodic arc process.

15. A sliding element according to claim 1, wherein the base receives a nitriding treatment or a PVD coating prior to receiving the connecting layer.

16. A sliding element according to claim 1, wherein the sliding element is one of a piston ring, tappet, bearing or pin.

17. An internal combustion engine comprising a sliding element having a ferrous base provided with a film applied upon a sliding surface, the film having, sequentially, a metal connecting layer, a transitional layer, and a contact layer, wherein:
- the transitional layer includes a carbide containing a metal element;
- the contact layer contains DLC (diamond-like carbon) doped with the metal element of the transitional layer, the DLC containing a maximum of 2% hydrogen by weight;
- an atomic ratio between metal and carbon in the contact layer in terms of the ratio Me/C is equal to or less than 0.1; and
- the connecting layer includes one of chromium, nickel or cobalt having a face centred cubic (fcc) structure.

18. A process for obtaining a sliding element for internal combustion engines, comprising:
- ion bombarding a ferrous base (2) to clean a surface of the sliding element which will receive a film;
- depositing a metal connecting layer;
- increasing flow of reactive gas to a maximum value such as to form a transitional layer; and
- depositing a contact layer under constant process conditions;
- wherein the connecting layer includes one of chromium, nickel or cobalt having a face centred cubic (fcc) structure.

19. A process according to claim 18, wherein the metal connecting layer is of tungsten.

20. A process according to claim 18, further comprising using at least two diametrically opposed targets of metal or graphite during the increasing of flow of reactive gas and depositing of the contact layer.

* * * * *